Milton F. Breeding,
Inventor,
Koenig, Pope, Senniger, and Powers,
Attorneys.

United States Patent Office 3,232,158 Patented Feb. 1, 1966

3,232,158

EXTRACTOR DEVICES FOR SEMICONDUCTOR NETWORKS AND THE LIKE

Milton F. Breeding, Dallas, Tex., assignor to Texas Instruments Incorporated, Dallas, Tex., a corporation of Delaware Filed Aug. 14, 1963, Ser. No. 302,145
7 Claims. (Cl. 83—140)

This invention relates to extractor devices for semiconductor networks and the like, and with regard to certain more specific features, to a punch and die apparatus for extracting desired portions of microminature semiconductor networks or the like from supporting fixtures therefor.

In the fabrication of compact electronic circuit apparatus employing hermetically sealed microminiature components such as integrated semiconductor networks or microcircuits, it has been proposed to employ fixtures, each in the nature of a supporting frame. The purpose of such a fixture is to support a component for protecting it and its leads while carrying it through certain portions of testing and assembling operations. While such a fixture has other functions, its significant function, insofar as the present invention is concerned, is to protect the supported component against distortion of its leads and damage to its hermetic seal.

The components themselves have exceedingly small body portions to each of which is secured a plurality of thin and delicate conductor copper or like leads. Each component has a spider form, the radial parts of which constitute these leads and the inner body of which is hermetically sealed. When the component is initially constructed, the leads are made longer than required in the final application of the component. These long leads are employed to mount the component on the frame which constitutes the fixture.

At some point in the process of manufacturing a printed-circuit board (for example) incorporating the component as a weldment thereon, it becomes necessary accurately to remove said central body with a portion of its leads. This is done by shearing away excess portions of the leads. Ordinary punches are not useful for this purpose because they tend to damage the hermetically sealed inner bodies of the spiders and to distort the geometry of the leads.

Therefore, among the several objects of the invention may be noted the provision of a device for extracting from a frame-mounted spider-shaped microminiature semiconductor component or the like, a segment of it, the segment including its central body portion and portions of its radiating leads; the provision of a device of the class described which will accomplish extraction without damage to the body portion or distortion of its leads; and the provision of a device of this type which may readily be incorporated in any of various squeezing mechanisms, such as presses or pliers. Other objects and features will be in part apparent and in part pointed out hereinafter.

The invention accordingly comprises the constructions hereinafter described, the scope of the invention being indicated in the following claims.

In the accompanying drawings, in which several of various possible embodiments of the invention are illustrated, FIG. 1 is a diagrammatic view in perspective, showing a semiconductor component which is frame-mounted and located between two shearing components of the device which is the subject of the invention:

Corresponding reference characters indicate corresponding parts throughout the several views of the drawings.

Figures 1, 2:
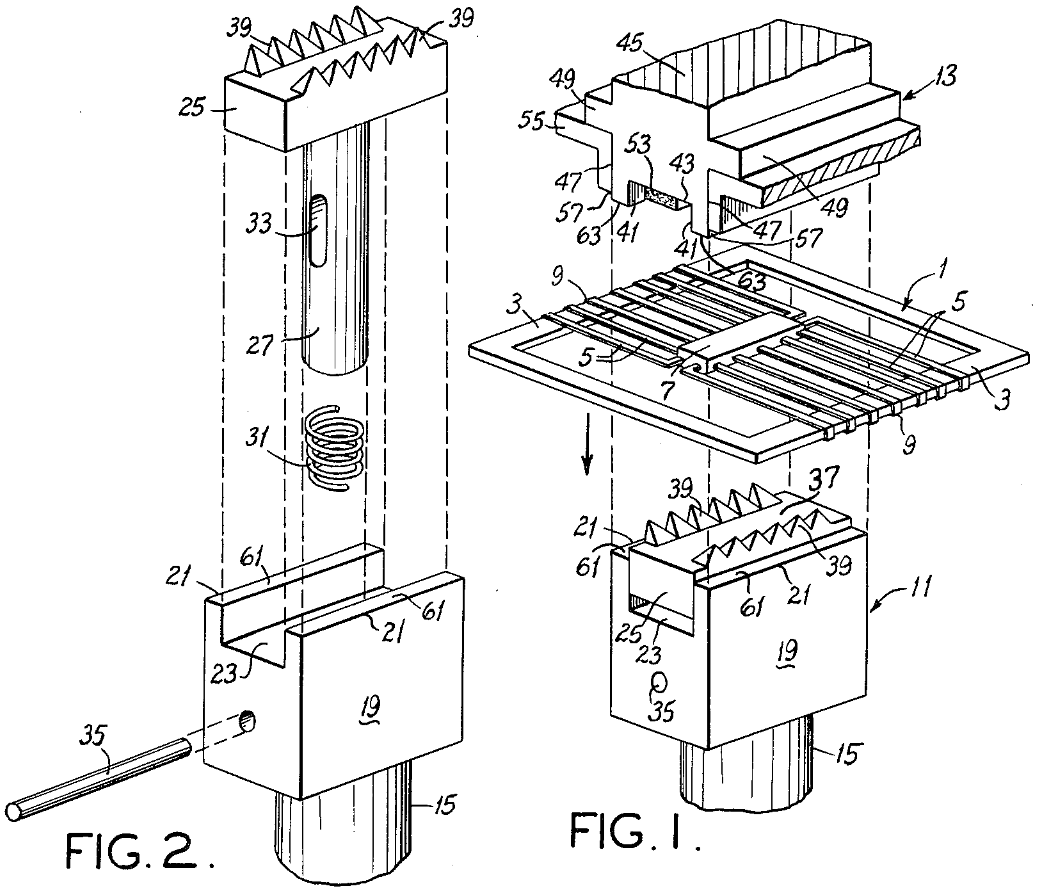
FIG. 2 is a diagrammatic exploded perspective view showing certain parts of a lower punch component of FIG. 1.

Referring now more particularly to FIG. 1, there is shown schematically at numeral 1 an example of a supporting frame such as above-mentioned. This frame has side members 3 which support the ends of conductive (copper, for example) leads 5, radiating from a central body 7 of a semiconductor network. Support may be accomplished, for example, by bending the ends 9 of the leads around the sides 3. The leads at this stage are longer than ultimately required, this length being primarily for the purpose of obtaining proper support on the frame 1.

Numeral 11 indicates in general a lower punch component or section and numeral 13 an upper die component or section. Component 11 includes a suitable post 15 for mounting it in a support 17, the latter being attached to a jaw (not shown) of a suitable press means (see FIGS. 4–6). The appropriate press may be of the conventional table or plier type. The post carries a punch block 19 having upper shearing edges 21. These are illustrated as being parallel but in some designs may be nonparallel.

Block 19 is recessed as shown at 23 to accept a slidable and resiliently mounted supporting block 25. The block 25 serves both alignment and resilient holding functions. It includes a lower stem 27 which is vertically movable in a hole 29 in the punch block 19. The hole 29 extends down from the recess 23 and at its bottom is a spring 31. A slot 33 in the stem 27 accepts a pin 35, supported crosswise in the block 19. Thus the block 25 is held captive but reciprocable in the shearing block 19, being biased upward by the spring 31. It may be pushed down a short distance against spring 31.

Figure 3:
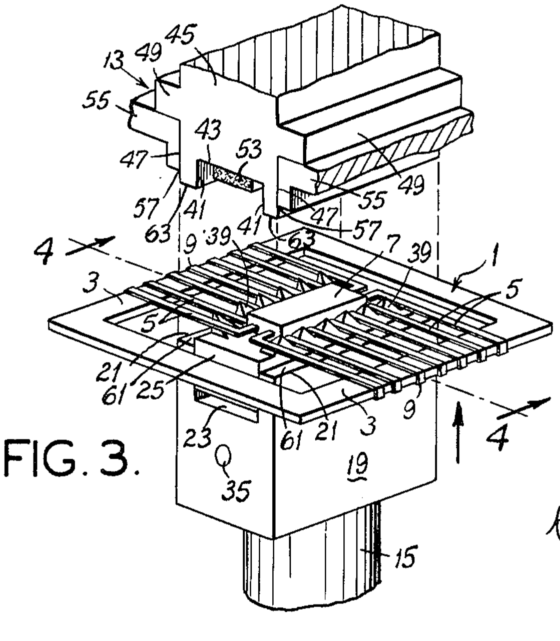
FIG. 3 is a view similar to FIG. 1, showing a frame-mounted semiconductor spider located on the lower punch component.

The upper surface of the block 25 carries two rows of locating projections 39, each one of which is in the form of a four-sided pyramid. The outer sides of the pyramids in each row are vertically coplanar. These outer sides are spaced apart a distance slightly less than the spacing between side walls 41 of a rectangular recess 43 in a second clamping block 45 in the upper die component 13. The inner faces of each row of projections are also coplanar, but in this case the defining planes flare out in an upward direction, so that when a central part 7 of an assembly 1, 7, 5 is applied, this assembly will be guided and properly located on the surface 37. The notches between the pyramids are arranged to accept the leads 5 and aid in proper alignment of assembly 1, 7, 5 when it is laid upon the block 25 (see FIGS. 1, 3 and 4). The wedge-shaped spaces between the projections are spaced and arranged to accord with whatever spacing there is between the leads 5. In the present example these spacings are regular.

Referring again to the upper die component or section 13, it consists of the holding or clamping block 45 in which is located the recess 41. This holding block 45 is slidable in an opening 47 in a die block 55 which is attached to the other jaw (not shown) of the press means. An appropriate press will provide for approach and recessive movements between punch and die sections 11 and 13. A flange 49 limits downward motion of block 45 and a spring 51 may be used for return action after upward movement. The spring 51 is reactive on the press jaw, which supports the die 55. Attached to the inner face of the recess 41 is a pad of resilient material 53 such as, for example, felt. The sides of member 45 register with the sides of member 19 and the sides of the opening 47 receive member 45 for sliding movement; also, the sides of the opening terminate in shearing edges 57 having a shearing conformation to the shearing edges 21 of member 19.

Figure 8:
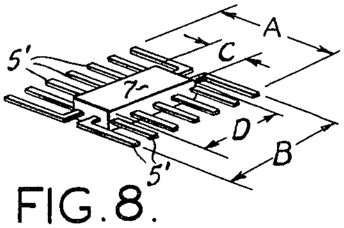
FIG. 8 is a perspective view showing the semiconductor network in its extracted form.
Figure 4:
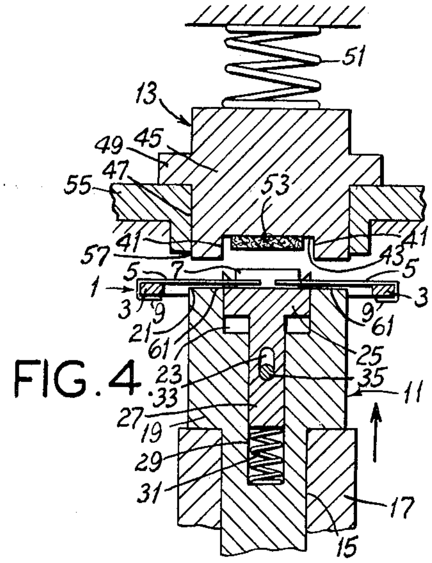
FIG. 4 is a cross section on line 4—4 of FIG. 3, showing parts in advanced positions and an additional spring return for an upper die component.
Figure 5:
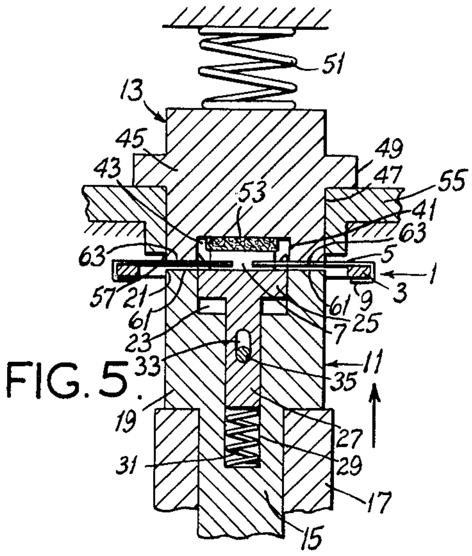
FIGS. 5 and 6 are views similar to FIG. 4, showing successive positions of punch and die parts during an extracting operation.
Figure 6:
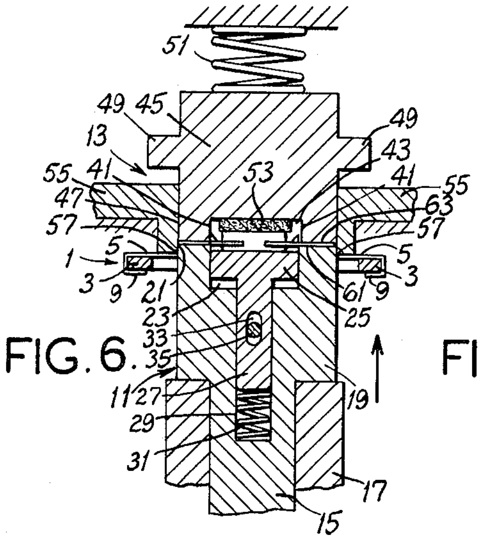
Figure 7:
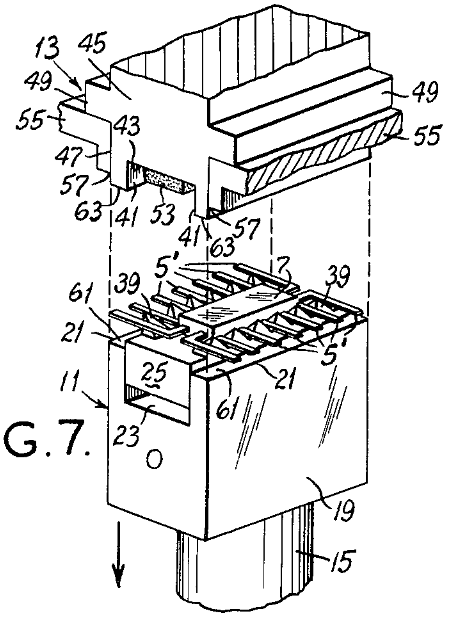
FIG. 7 is a perspective view showing the lower and upper punch and die component in separated positions after an extraction.

Operation is as follows, assuming that a frame and spider assembly 1, 7, 5 has been deposited upon the holding block 25 (compare FIGS. 1 and 3):

The lower shearing component 11 is then advanced up to approach the die component 13, as illustrated in FIGS. 4–6. When the condition of the parts is reached as shown in FIG. 5, the central body 7 has been pushed up by the resilient support 25 to engage the resilient pad 53. This occurs as the projections 39 enter the recess 41. Thus the assembly 1, 7, 5 is held in precise position to be sheared as the parts continue upward movement to the FIG. 6 position. During the first part of this last lifting movement, surfaces 61 of member 19 clamp the leads 5 against surfaces 63 of member 45. Since the pad 53 is resilient and member 27 floats on spring 31, the inner portions of the leads 5 and the central body 7 reamin coplanar with the outer clamped ends of the leads 5. The lifting movement terminates by the shearing edges 21 of the block 19 entering into the opening 47, the sides of which form the shearing edges 57. These edges 57 cooperate with the shearing edges 21 and shear away the desired central portions of the leads 5, along with the central body 7 from which they extend (FIGS. 7 and 8). During shearing the central portions of the parts to be extracted are resiliently and protectively supported. Upon retraction of the punch section 11 from the die section 13, the sheared-out spider portion maintains a position on the block 19, as shown in FIG. 7, from which it may be removed. The peripheral scrap (not shown) is removable from the apparatus in any appropriate manner.

In view of the above, it will be seen that the punch has several advantages. It is designed to accept the assembly 1, 7, 5 and properly orient it by the operator lightly depositing it on the blocks 25 (compare FIGS. 1 and 3). Preparatory to shearing, this assembly 1, 7, 5 is clamped between upper faces 61 of the block 19 and lower faces 63 of the block 45, the clamping action being on the leads 5 only. As shearing operation takes place, the central portion of assembly 1, 7, 5 is resiliently held in a protective enclosure. Thus while shearing action takes place there will be no distortion of the parts which are extracted. Thus the highly delicate extracted piece such as shown in FIG. 8 receives no damage to its central portion 7 and its remaining cut radial leads (lettered 5′ in FIGS. 7 and 8) are retained during shearing in their original accurate geometrical attitudes with respect to the central body.

It may be mentioned that the outside dimensions A and B of the extracted device or spider are, for example, on the order of only .30 x .40 inch, respectively, and the outside dimensions C and D of the body are on the order or .12 and .25 inch, respectively. The thickness of the body 7 is on the order of .030 inch. The thickness of the copper leads 5 may be .005 inch or less and their widths are little more. These facts are mentioned to emphasize the utility of the punch in maintaining the desired geometric form of such delicate devices as those herein described.

It will be noted that when work is placed on the support 25 the body 7 is automatically cradled between the inwardly sloping projections 39 while the leads 7 are interdigitated between them.

In view of the above, it will be seen that the several objects of the invention are achieved and other advantageous results attained.

As various changes could be made in the above constructions withous departing from the scope of the invention, it is intended that all matter contained in the above description or shown in the accompanying drawings shall be interpreted as illustrative and not in a limiting sense.

What is claimed is:

1. An extractor device for operation by pressing means, comprising punch and die sections, said punch section comprising a punch block having a first recess, said die section including a die block, a holding block movable in the die block and having a second recess, said die block being shaped for shearing action with the punch block on shear lines outside of said recesses upon approach movements therebetween, a supporting block resiliently mounted in said first recess of the punch block, said supporting block having locating means normally above the punch block recess for a semiconductor network of spider form including a central body and radial leads, said locating means on said supporting block having a central support for said body flanked by rows of protrusions for interdigitation with said leads, resilient means in the recess of the holding block initially engageable by said central body upon the occurrences of approach movements, said holding block and said punch block having opposed faces outside of the recesses respectively and inside said shear lines, so that upon succeeding approach movements the die and holding blocks bring said recesses together and clamp said radial leads, said punch block and die block thereafter shearing said clamped radial leads upon final approach movement.

2. An extractor device according to claim 1, wherein said rows of protrusions are of outwardly and upwardly tapering forms on their insides, providing receptive cradle means for said body, said protrusions on their outsides being shaped for guided movements into said recess of the holding block.

3. A device for extracting a central body and connected radial lead parts of a semiconductor device in the form of a spider, the leads of which are outwardly supported by a surrounding frame; comprising a support having groups of spaced projections for receiving the body between groups and the leads in the spaces between projections, a punch block, means resiliently holding the support on the punch block, the punch block having first clamping faces engageable with the leads within the frame and a first group of transverse shearing edges for cutting the leads within the frame and outside of said clamping faces, a die block having a second group of shearing edges cooperable with said first group of shearing edges, a movable holding block in said die block having second clamping faces opposed to said first clamping faces and engageable with said leads to clamp them, and resilient means in said holding block cooperable with said resiliently held support to resiliently hold said body during the clamping and shearing of said leads.

4. A device according to claim 3, wherein said support has a face between groups of projections for seating said body, the inner sides of the groups of projections flaring outwardly from said face and each space between projections being in the form of a triangular notch for receiving a lead.

5. A device according to claim 4, wherein the holding block has a recess containing said resilient means and wherein said resilient means is a soft pad for engagement with said body, 6. A device according to claim 5, wherein the outsides of each group of projections are in a common plane parallel to the other said recess in the holding block having flat sides for close reception of said outsides of the groups of projections.

7. A device according to claim 6, wherein each projection is of unsymmetrical pyramidal shape.

References Cited by the Examiner

UNITED STATES PATENTS

| | | | |
|---|---|---|---|
| 1,149,695 | 8/1915 | Sonneborn | 83—128 |
| 1,493,994 | 5/1924 | Lefere | 83—143 X |
| 2,374,436 | 4/1945 | Kennedy et al. | 83—139 |

WILLIAM W. DYER, Jr., *Primary Examiner.*

WILLIAM S. LAWSON, *Examiner.*